United States Patent
Jung et al.

[11] Patent Number: 5,950,105
[45] Date of Patent: Sep. 7, 1999

[54] COMPLETELY BURIED CONTACT HOLES AND METHODS OF FORMING SAME

[75] Inventors: Woo-sang Jung; Gil-heyun Choi, both of Kyungki-do; Ji-soon Park, Seoul; Byeong-jun Kim, Kyungki-do, all of Rep. of Korea

[73] Assignee: Samsung Electronics Co., Ltd., Rep. of Korea

[21] Appl. No.: 08/821,067

[22] Filed: Mar. 20, 1997

Related U.S. Application Data

[62] Division of application No. 08/688,606, Jul. 30, 1996, Pat. No. 5,834,847.

[30] Foreign Application Priority Data

Jul. 31, 1995 [KR] Rep. of Korea ................... 95-23532

[51] Int. Cl.⁶ .................................................. H01L 21/768
[52] U.S. Cl. ..................... 438/660; 438/629; 438/632; 438/646; 438/648; 438/653; 438/672; 438/760
[58] Field of Search ................................ 438/660, 653, 438/672, 646, 648, 760, 656, 685, 632, 629, 926, FOR 493

[56] References Cited

U.S. PATENT DOCUMENTS

| | | | |
|---|---|---|---|
| 5,032,233 | 7/1991 | Yu et al. | 438/662 |
| 5,449,644 | 9/1995 | Hong et al. | 438/632 |
| 5,490,901 | 2/1996 | Kim | 438/638 |
| 5,534,463 | 7/1996 | Lee et al. | 438/643 |
| 5,543,357 | 8/1996 | Yamada et al. | 438/646 |
| 5,834,847 | 11/1998 | Jung et al. | 257/773 |

OTHER PUBLICATIONS

U.S. application No. 08/048,391, Jung et al., filed Mar. 26, 1998.

*Primary Examiner*—John F. Niebling
*Assistant Examiner*—Ha Tran Nguyen
*Attorney, Agent, or Firm*—Myers Bigel Sibley & Sajovec

[57] ABSTRACT

A method for forming a completely buried contact hole and a semiconductor device having a completely buried contact hole in an interconnection structure is disclosed. The completely buried contact hole includes a first insulating layer of a first thermal conductivity having a contact hole formed therein. A region of material of a second thermal conductivity formed in the first insulating layer adjacent the location of the contact hole. The second thermal conductivity is greater than the first thermal conductivity such that the thermal conductivity of the region of material is greater than the thermal conductivity of the insulating layer. A metal is formed in the hole which completely buries the contact hole. The method includes forming in an insulator adjacent a contact hole a region of material of a higher thermal conductivity than the insulating layer, depositing a metal in the contact hole and heating the metal, the insulating layer and the region of material of a higher thermal conductivity to flow the metal into the contact hole so as to completely bury the contact hole.

12 Claims, 5 Drawing Sheets

COMPLETELY BURIED CONTACT HOLES AND METHODS OF FORMING SAME

RELATED APPLICATION

This application is a divisional of application Ser. No. 08/688,606, filed Jul. 30, 1996 now U.S. Pat. No. 5,834,847.

This application is related to and claims priority from Korean Application Serial No. 95-23532 filed Jul. 31, 1995.

FIELD OF THE INVENTION

The present invention relates to semiconductor devices and fabrication methods, and more particularly to buried contacts and methods of forming buried contacts.

BACKGROUND OF THE INVENTION

To increase the integration of semiconductor devices efforts must be made to improve the yield, performance and reliability of the highly integrated semiconductor devices. As metal interconnection technology is one of the most important steps in the semiconductor device manufacturing process, improvements in the metal interconnection technology can result in improvements in the yield, performance and the reliability of integrated devices. In a conventional low density semiconductor device, burial of a contact hole by a metal did not present difficulties because, in general, the contact hole in a low density semiconductor device has a low aspect ratio and small step difference.

As integration of devices has increased, the size of the contact hole has been reduced remarkably. If a conventional aluminum (Al) metal interconnection method is adopted for manufacturing a highly integrated semiconductor device, step coverage of the aluminum deposited by sputtering becomes poor due to the high aspect ratio of the contact hole. Thus, the reliability of the aluminum interconnection is lowered. Also, shallow junction characteristics are deteriorated because of the increase in contact resistance caused by the precipitation of silicon and aluminum spiking.

FIGS. 1 to 3 are sectional views illustrating a conventional method of manufacturing a semiconductor device in which a contact hole is buried with a metal. FIG. 1 shows the step of forming a first metal layer. As seen in FIG. 1, a contact hole 5 of diameter 0.8 $\mu$m has and upper portion in the shape of a staircase. The contact hole 5 is formed on an insulating layer 3 of a semiconductor device. After the insulating layer 3 is formed, the semiconductor substrate 1 is cleaned. Subsequently, a barrier layer 7 made of refractory metal compound such as TiN is deposited on the insulating layer 3 and the exposed surface of the substrate 1. Then, a metal such as pure aluminum or aluminum alloy is deposited on the barrier layer 7 in a sputter chamber (not shown), to form a first metal layer 9. The first metal layer 9 has small grains and high surface free energy and is deposited at a low temperature and predetermined vacuum to a thickness of two-thirds the thickness of the final thickness of the metal layer 9.

FIG. 2 shows the step of burying the contact hole 5. As illustrated in FIG. 2, when the first metal layer 9 is heated at about 580° C. in a sputter chamber (not shown) without vacuum break, the aluminum grains are moved to the contact hole 5. The movement of the aluminum grains decreases the surface energy, so that the surface area decreases and the contact hole 5 is buried with aluminum, as shown in FIG. 2.

FIG. 3 illustrates the step of forming a second metal layer 11 on the first metal layer 9. The second metal layer 11 is deposited on the first metal layer 9 at 350° C. or below, to a thickness of one-third the desired final thickness of the metal layer. The second metal layer 11 is made of aluminum alloy including silicon, such as Al-Si or Al-Cu-Si. Subsequently, the second metal layer 11, the first metal layer 9 and the barrier layer 7 are patterned to complete the formation of the metal interconnection.

As illustrated in FIGS. 4 and 5, in the semiconductor device formed according to the conventional method, the contact hole may be incompletely buried. FIGS. 4 and 5 are photographs taken by a scanning electron microscope (SEM), showing the cross-section of the contact hole of the semiconductor device which is incompletely buried, according to the conventional method.

In the conventional method, the step of burying the contact hole 5 shown in FIG. 2 occurs while the first metal layer 9 is heated. During heating, the contact hole 5 is buried with aluminum by the movement of metal atoms. However, the contact hole 5 may be incompletely buried by the conventional heating process of heating at a temperature of 580° C. for 90 seconds, as FIGS. 4 and 5 illustrate.

The degree to which the contact hole 5 is buried by the metal depends on the shape, size and aspect ratio of the contact hole, and the heating time and temperature. As shown in FIGS. 4 and 5, the contact hole may be incompletely buried when the aspect ratio of the contact hole is high. The most effective factor in increasing the degree to which the contact hole is buried is the heating temperature. That is, when the heating temperature is high, the contact hole can be completely buried. However, the high temperature causes a spiking of the metal layer which deteriorates the electrical characteristics in the metal connection. Therefore, it is undesirable to increase the heating temperature to a temperature sufficient to completely bury the contact hole with metal.

SUMMARY OF THE INVENTION

It is therefore an object of the present invention to provide improved methods of forming a buried contact hole for a semiconductor device.

It is another object of the present invention to provide a completely buried contact hole without heating the contact hole to a temperature sufficient to deteriorate the connection.

It is a further object of the present invention to provide a method of forming a completely buried contact hole which overcomes the problems of high aspect ratio in the contact hole and a large step difference.

These and other objects of the present invention are provided by a semiconductor device having a completely buried contact hole in an interconnection structure. The structure of the completely buried contact hole includes a first insulating layer of a first thermal conductivity having a contact hole formed therein. A region of material of a second thermal conductivity is formed in the first insulating layer adjacent the location of the contact hole. The second thermal conductivity is greater than the first thermal conductivity such that the thermal conductivity of the region of material is greater than the thermal conductivity of the insulating layer. The region of material of the second conductivity type is position such that metal formed in the hole completely buries or fills the contact hole.

The inclusion of the region of material of high thermal conductivity more quickly and evenly distributes heat to the surfaces of the contact hole so that the reflow of deposited metal into the contact hole is more uniform. This allows the metal to completely bury the contact hole without requiring the heating time or temperature of the reflow heating process to be increased. Thus, the local effective temperature and time of the reflow heating process is increased for the perimeter of the contact hole without increasing the global temperature and time of the process.

In a further embodiment of the present invention, the region of material comprises an auxiliary conductive layer pattern. The region of material may be in the shape of a line adjacent the contact hole or may surround the contact hole. The region of material may also be electrically isolated from active semiconductor devices in the semiconductor device. Furthermore, a conductive path may also be formed in the first insulating layer for interconnecting active semiconductor devices in the semiconductor device.

In a preferred embodiment, the region of material is comprised of a material selected from the group consisting of heat conductive refractory metals and heat conductive refractory metal silicides. More particularly, the region of material may be selected from the group consisting of tungsten, titanium, titanium nitride, and tantalum.

In one particular embodiment of the present invention, the region of material has a thickness of from about 100 to about 3000 angstroms.

In a further alternative embodiment of the present invention, the region of material is patterned in a shape which allows direct application of heat to the region of material. Thus, in certain embodiments of the present invention, the region of material may be directly exposed to the high temperature environment to more effectively conduct heat to the surfaces of the contact hole. In other embodiments, the thermal conductivity of the region of material is utilized to increase the effective thermal conductivity of the region of material adjacent the contact hole to thereby improve heating uniformity.

The present invention also provides a method of completely burying a contact hole through an insulating layer with a metal. The method includes forming in the insulator adjacent the contact hole a region of material of a higher thermal conductivity than the insulating layer. A metal is then deposited in the contact hole. The metal, the insulating layer and the region of material of a higher thermal conductivity are heated to flow the metal into the contact hole so as to completely bury the contact hole.

In a further embodiment of the present invention, a plurality of regions of higher thermal conductivity material are formed adjacent the contact hole.

In an alternative embodiment, the method further comprises forming a region of higher thermal conductivity material on a first interlayer insulating layer and then forming a second interlayer insulating layer to cover the region of higher thermal conductivity material. A contact hole is formed through the first and the second interlayer insulating layers adjacent the region of higher thermal conductivity material.

In an further embodiment a barrier layer is formed on the second interlayer insulating layer prior to depositing the metal in the contact hole.

In one embodiment of the present invention, the metal is deposited by sputtering onto the second interlayer insulating layer a metal after forming a contact hole.

In a particular embodiment of the present invention, a contact hole for a semiconductor device is provided. The contact hole includes a first interlayer insulating layer formed on a semiconductor material and a first region of material of a first thermal conductivity formed on the first interlayer. A second interlayer insulating layer of a second thermal conductivity lower than the first thermal conductivity is formed on the first interlayer insulating layer and covering the first region of material. An opening is formed in the second interlayer insulating layer which extends downward through the second interlayer insulating layer and the first interlayer insulating layer to the semiconductor material. Metal is formed in the opening and substantially fills the opening to create a completely buried contact hole.

In a still further embodiment of the present invention, a second region of material of a first thermal conductivity is formed on the second interlayer insulating layer adjacent the opening and a third interlayer insulating layer having a thermal conductivity less than the first thermal conductivity is formed on the second interlayer insulating layer covering the second region of material. In such a case the opening is further formed in the third interlayer insulating layer and extends downward through the second and the first interlayer insulating layers to the semiconductor material.

The above objects and advantages of the present invention will become more apparent by describing in detail preferred embodiments thereof with reference to the attached drawings in which:

DESCRIPTION OF PREFERRED EMBODIMENTS

Figure 1:
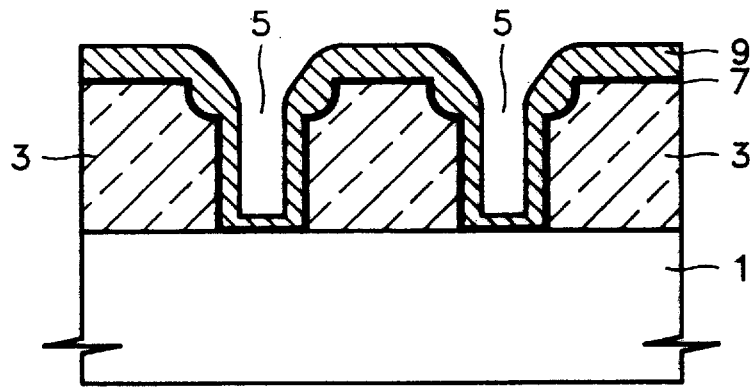
FIGS. 1 to 3 are sectional views for illustrating a method of manufacturing a semiconductor device in which a contact hole is buried according to a conventional method.
Figure 2:
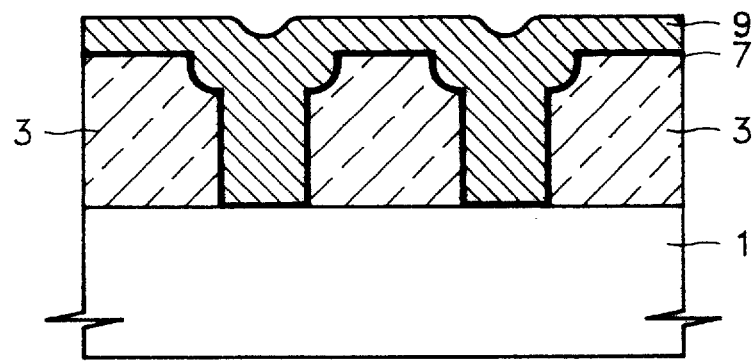
Figure 3:
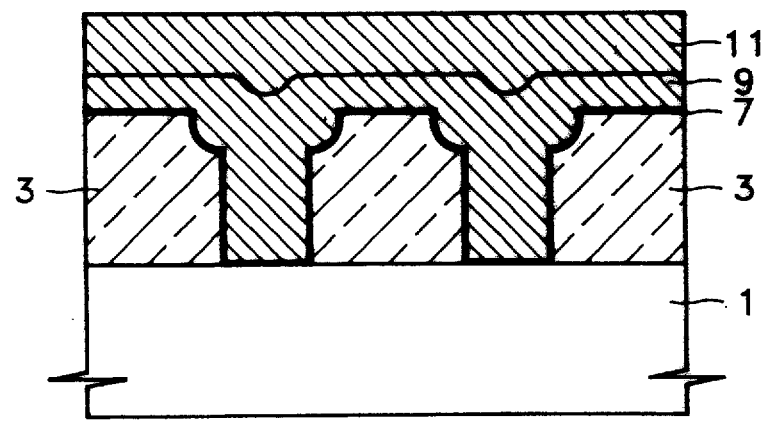

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

In order to completely bury a contact hole with a metal without increasing of the heating temperature or time, an increased amount of heat should be transferred to the incompletely buried portion during the heating process. Specifically, an increased amount of heat may be transferred to the incompletely buried portion of the contact hole by forming an auxiliary conductive layer pattern having greater thermal conductivity than the surrounding interlayer insulating layers (such as those formed of silicon dioxide) adjacent to the contact hole formed in the interlayer insulating layer, so that the heat is more uniformly transferred to the periphery of the contact hole during the heating process. Consequently, a local increase in the effective heating temperature or time is provided to the periphery of the contact hole. Therefore, the contact hole can be completely buried without changing the overall heating temperature or time.

Preferably, the auxiliary conductive layer pattern is formed in the interlayer insulating layer with a refractory metal or refractory metal silicide having excellent thermal conductivity in a thickness of 100 to 3000 Å. The auxiliary conductive layer pattern may be formed in a line shape or a shape which surrounds the contact hole. Tungsten (W), titanium (Ti), titanium nitride (TiN) or tantalum (Ta) may be used as the refractory metal. The auxiliary conductive pattern layer may also be formed of a lower conductive layer such as a gate line or bit line, so that an additional process is not required.

The present invention will now be described in further detail with reference to FIGS. 6 to 10 which are sectional views illustrating a method of manufacturing a semiconductor device in which a contact hole is buried according to the present invention. FIGS. 6 to 10 illustrate the basic method steps of the present invention and the possible structures of the present invention. In general, as illustrated in FIGS. 6 to 10 the steps of forming in an insulator layer adjacent a contact hole a region of material of a higher thermal conductivity than the insulating layer and depositing a metal in the contact hole. FIGS. 6 to 10 also illustrate heating the metal, the insulating layer and the region of material of a higher thermal conductivity to flow the metal into the contact hole so as to completely bury the contact hole. In fact, as illustrated in FIGS. 6 to 10, a plurality of regions of higher thermal conductivity material are formed adjacent the contact hole.

Figure 6:
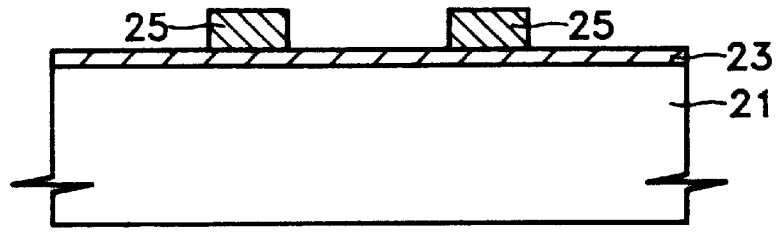
FIGS. 6 to 10 are sectional views for illustrating a method of manufacturing a semiconductor device in which a contact hole is buried according to the present invention.

FIG. 6 illustrates the first step in forming a buried contact according to one embodiment of the present invention. As seen in FIG. 6, a first region of material of a first thermal conductivity 25, which may be a first auxiliary conductive layer pattern, is formed on a first interlayer insulating layer 23. The first interlayer insulating layer 23 is formed on a semiconductor substrate 21. The first auxiliary conductive layer pattern 25 is formed adjacent to a predetermined position on the first interlayer insulating layer 23 in a line shape or a shape substantially enclosing the predetermined position. The predetermined position should be selected to correspond to the desired location of the contact hole to be formed. The first region of material of higher thermal conductivity 25 may be formed in a thickness of from about 100 to about 3000 Å. The first region of material of higher thermal conductivity 25 is preferably formed of a refractory metal or refractory metal silicide. The refractory metal may be selected from the group consisting of tungsten (W), titanium (Ti), titanium nitride (TiN) and tantalum (Ta).

The first region of material 25 may be electrically isolated from any active electrical devices such as semiconductor devices such that the region of higher thermal conductivity material does not function as an electrical interconnection between active devices. A conductive path may also be formed for interconnecting active electrical devices. Thus, a first conductive layer pattern (not shown) such as a gate line may also be formed on the first interlayer insulating layer 23.

Figure 7:
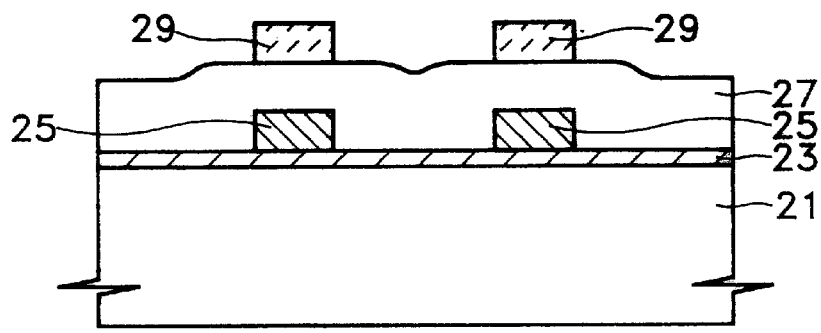

FIG. 7 shows the step of forming an optional second region of higher thermal conductivity material 29 on a second interlayer insulating layer 27. As seen in FIG. 7, the second interlayer insulating layer 27 is formed on the first interlayer insulating layer 23 and covers the first region of higher thermal conductivity material 25 to insulate the region of higher thermal conductivity material 25.

FIG. 7 also illustrates an optional second region of higher thermal conductivity material 29 formed adjacent to the predetermined position on the second interlayer insulating layer 27 in a line shape or a shape which substantially surrounds the predetermined position. As with the first region of material 25, the second region of higher thermal conductivity material 29 may be formed in a thickness of from about 100 to about 3000 Å. The second region of material 29 is preferably formed with a refractory metal or refractory metal silicide. The refractory metal may be selected from the group consisting of tungsten (W), titanium (Ti), titanium nitride (TiN) and tantalum (Ta).

The optional second region of material 29 may be electrically isolated from any active electrical devices such as semiconductor devices such that the region of higher thermal conductivity material does not function as an electrical interconnection between active devices. A conductive path may also be formed for interconnecting active electrical devices. Thus, a first conductive layer pattern (not shown) such as a gate line may also be formed on the second interlayer insulating layer 27.

Figure 8:
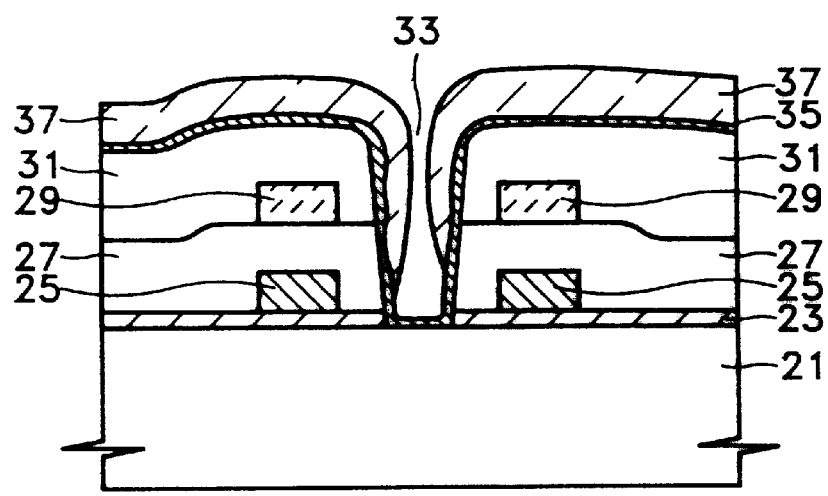

FIG. 8 shows the step of forming a contact hole 33 and a metal layer 37. As seen in FIG. 8, a third interlayer insulating layer 31 is formed on the second insulating layer 27 which insulates the second region of higher thermal conductivity 29. A contact hole 33 is formed at the predetermined location and extends through the third interlayer insulating layer 31, the second interlayer insulating layer 27 and the first interlayer insulating layer 23 to the surface of the semiconductor substrate 21 to expose a portion of the substrate 21. Then, the surface of the structure is cleaned and a barrier layer 35 made of a refractory metal compound such as titanium nitride (TiN) is deposited on the third interlayer insulating layer 31, the inside wall of the contact hole 33 and the exposed surface of the semiconductor substrate 21. In a particular embodiment, titanium nitride layer is deposited on titanium and annealed to thereby form the barrier layer 35.

After forming the barrier layer 35, a metal such as pure aluminum or aluminum alloy is deposited on the barrier layer 35 in a sputter chamber (not shown), to form the metal layer 37. The metal layer 37 is deposited under low temperature conditions and at a predetermined vacuum so as to provide small aluminum grains and high surface free energy.

Figure 9:
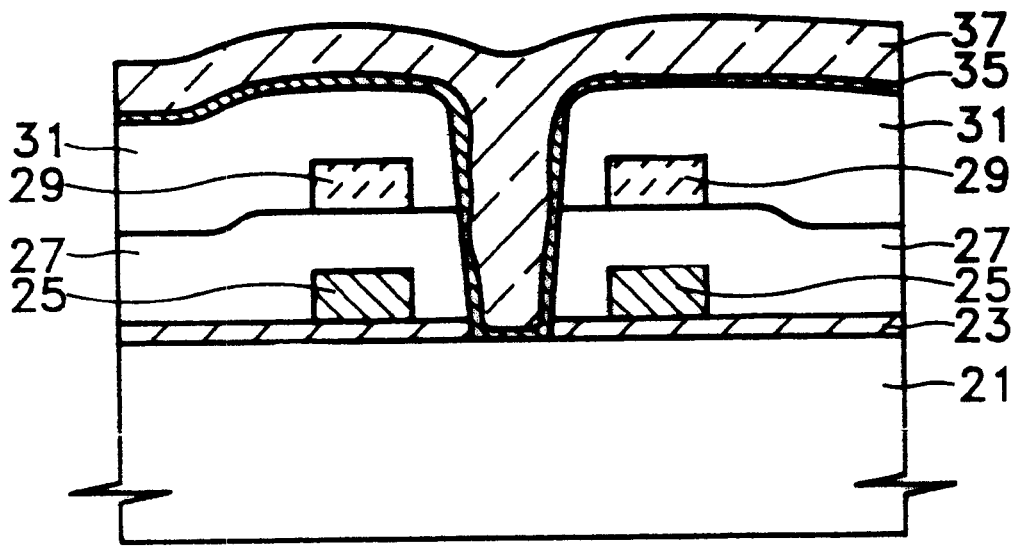
Figure 10:
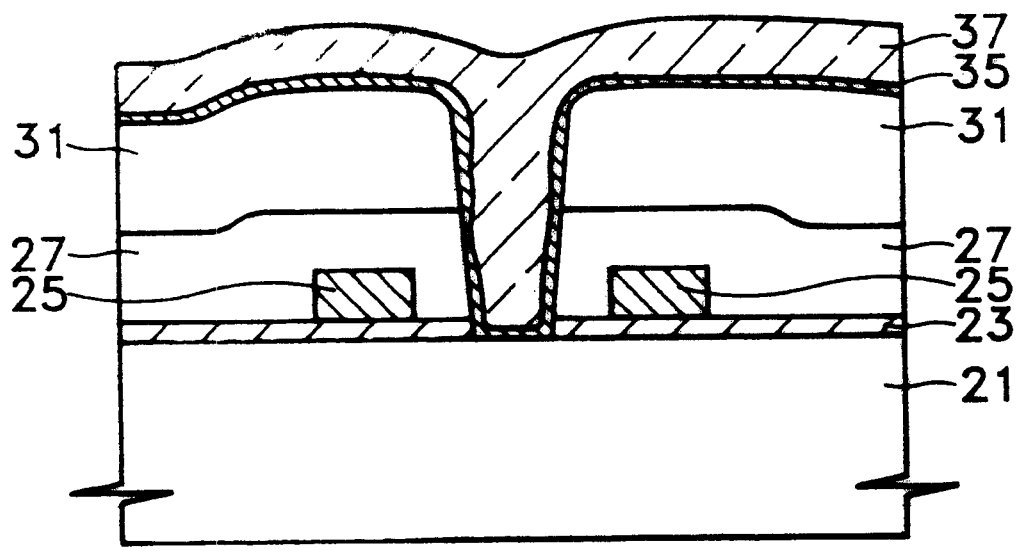

FIGS. 9 and 10 show the step of burying the contact hole 33 in two alternative embodiments of the present invention. As illustrated in FIG. 9, when the metal layer 37 is heated at about 580° C. in a sputter chamber (not shown) without breaking the vacuum, the aluminum grains are moved into contact hole 33. A local increase in the effect of the heating temperature or time is generated by the first and second regions of higher thermal conductivity material 25 and 29, so that the contact hole 33 is buried with aluminum as shown in FIG. 9. If the step of forming the second region of higher thermal conductivity material 29 is omitted, then the structure of FIG. 10 can be obtained. That is, the contact hole 33 can be completely buried with only the first region of material of higher thermal conductivity 25. Also, forming only the second region of material of higher thermal conductivity 29 can result in the same effect.

As can be seen from the FIGS. 6 to 10, the distance that the region of higher thermal conductivity material is formed from the contact hole may be less than the depth of the sidewall of the contact hole. Thus, for example, region 25 is positioned at a distance from the sidewall of the contact hole 33 which is less than the depth of the contact hole 33.

While the regions of higher thermal conductivity need not be directly exposed to the heat source, it may be desirable to further increase the uniform and rapid heating of the walls of the contact hole that the regions of higher thermal conductivity material be patterned in a shape which allows direct application of heat to the region of material. Thus, heat could be more readily conducted to the insulating layers and semiconductor material which form the walls of the contact hole.

Figure 4:
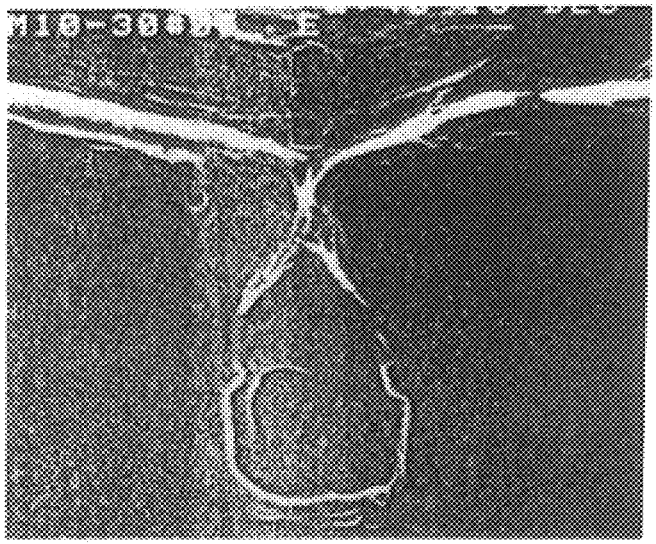
FIGS. 4 and 5 are photographs taken by a scanning electron microscope, showing the cross-section of the contact hole of the semiconductor device which is not completely buried, according to the conventional method.
Figure 5:
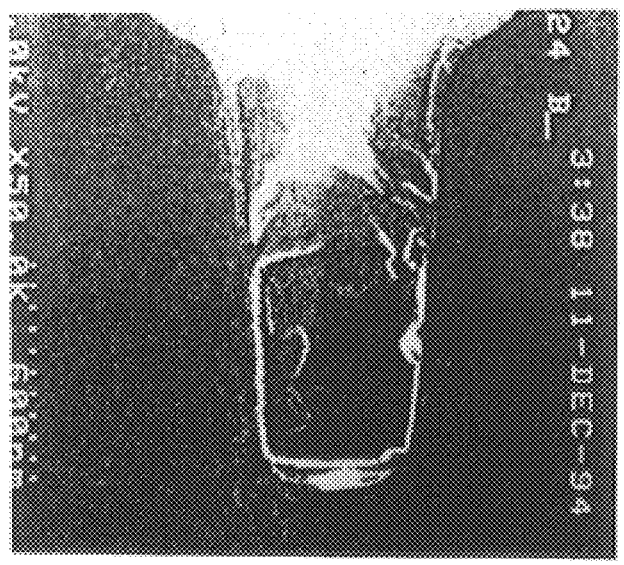
Figure 11:
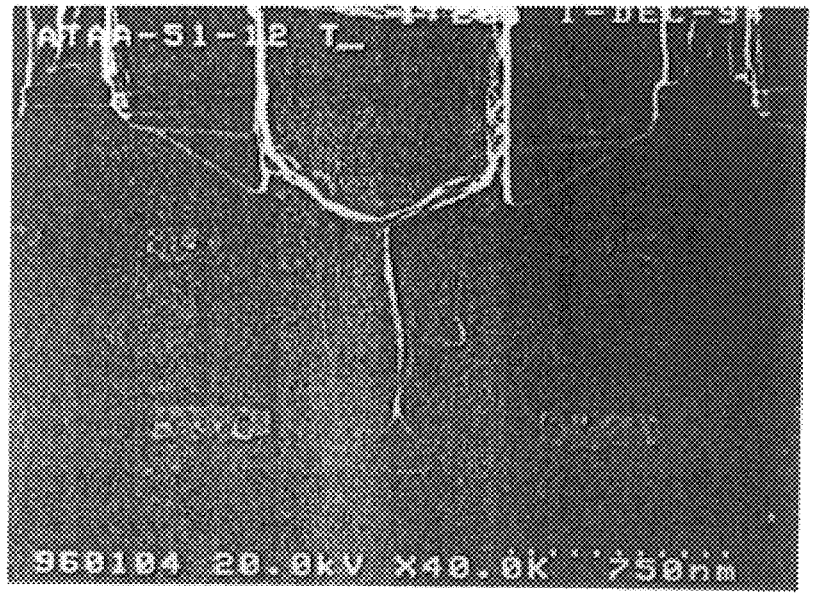
FIGS. 11 and 12 are photographs taken by a scanning electron microscope, showing the cross-section of the contact hole of the semiconductor device which is completely buried, according to the present invention.
Figure 12:

FIGS. 11 and 12 are photographs taken by a scanning electron microscope, showing the cross-section of the contact hole of the semiconductor device which is completely buried, according to the present invention. In comparison with the conventional contact hole which is not completely buried as shown in FIGS. 4 and 5 it is seen that the contact hole in FIGS. 11 and 12 is completely buried with the metal. The inventors believe that these improved results are due to the region of material of higher thermal conductivity adjacent to the contact hole. FIG. 12, which is a photograph showing the results of utilization of the structure shown in FIG. 10, shows that the contact hole can be completely buried with only the first region of material of higher thermal conductivity.

While the present invention has been illustrated and described with reference to specific embodiments, the present invention is not limited to the particular forms illustrated and further modifications and improvements that do not depart from the spirit and scope of the present invention will occur to those skilled in the art.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of completely burying a contact hole through an insulating layer with a metal, the method comprising the steps of:

forming in the insulator adjacent the contact hole a region of material of a higher thermal conductivity than the insulating layer; then depositing a metal in the contact hole;

heating the metal, the insulating layer and the region of material of a higher thermal conductivity to flow the metal into the contact hole so as to completely bury the contact hole; and wherein said forming step comprises forming the region of material of a higher thermal conductivity in a position with respect to the contact hole so as to allow said metal to completely fill said contact hole.

2. A method according to claim 1, wherein said forming step comprises the step of forming a region of material of higher thermal conductivity having a thickness of from about 100 to about 3000 angstroms.

3. A method according to claim 1, wherein said forming step comprises the step of forming a plurality of regions of higher thermal conductivity material adjacent the contact hole.

4. A method according to claim 1, wherein said forming step comprises the steps of:

forming a region of higher thermal conductivity material on a first interlayer insulating layer; then forming a second interlayer insulating layer to cover the region of higher thermal conductivity material;

forming a contact hole through the first and the second interlayer insulating layers adjacent the region of higher thermal conductivity material.

5. A method according to claim 4, further comprising the step of forming a barrier layer on the second interlayer insulating layer prior to said depositing step.

6. A method according to claim 4, wherein said depositing step comprises the step of sputtering onto the second interlayer insulating layer a metal after said step of forming a contact hole.

7. A method according to claim 1, wherein said depositing step comprises the step of depositing a metal selected from the group consisting of tungsten, titanium, titanium nitride and tantalum.

8. A method according to claim 1, wherein said forming step comprises forming a region of higher thermal conductivity material than the insulating layer which surrounds the contact hole.

9. A method according to claim 1, said method further comprising the step of electrically isolating the region of material from active semiconductor devices.

10. A method according to claim 1, said method further comprising the step of forming a conductive path in the insulating layer for interconnecting active electrical devices.

11. A method according to claim 1, wherein said forming step comprises the step of forming an electrically inactive region of material of a higher thermal conductivity in a position with respect to the contact hole so as to allow said metal to completely fill said contact hole.

12. A method according to claim 1 wherein said forming step further comprises forming the region of higher thermal conductivity so as to allow direct exposure of the material to a high temperature environment during said heating step.

* * * * *